United States Patent
Amerian et al.

[19]

[11] Patent Number: 6,075,396
[45] Date of Patent: Jun. 13, 2000

[54] USING POWER-ON MODE TO CONTROL TEST MODE

[75] Inventors: Mehran Amerian, Campbell; Max Hamidi, San Jose, both of Calif.

[73] Assignee: S3 Incorporated, Santa Clara, Calif.

[21] Appl. No.: 09/099,630

[22] Filed: Jun. 18, 1998

[51] Int. Cl.[7] .................................................. G01R 31/28
[52] U.S. Cl. .......................................... 327/198; 714/734
[58] Field of Search .................................... 327/198, 200, 327/218; 714/726, 733, 734

[56] References Cited

U.S. PATENT DOCUMENTS

| | | | |
|---|---|---|---|
| 5,144,627 | 9/1992 | Horie et al. ............................... | 714/724 |
| 5,416,784 | 5/1995 | Johnson .................................... | 714/733 |
| 5,479,127 | 12/1995 | Bui ........................................... | 327/174 |
| 5,889,787 | 3/1999 | Cauchy .................................... | 714/733 |

Primary Examiner—Tuan T. Lam
Attorney, Agent, or Firm—Haverstock & Owens LLP

[57] ABSTRACT

The improved pin system enables a single, shared pin of a semiconductor device to have multiple functions that include: receiving data that determines the operating mode of the semiconductor device and also receiving data unrelated to the operating mode of the semiconductor device. The improved pin system comprises the single, shared pin coupled to a data latch. The data latch is configured to store operating mode data from the single, shared pin. This operating mode data preferably corresponds to a particular operating mode such as a functional mode or a test mode. Preferably, in response to the operating mode data stored in the data latch, the semiconductor device operates in either the functional mode or the test mode. As long as the data latch stores the operating mode data, this shared, single pin is capable of receiving data unrelated to the operating mode of the semiconductor device without changing the current operating mode of the semiconductor device.

9 Claims, 2 Drawing Sheets

6,075,396

USING POWER-ON MODE TO CONTROL TEST MODE

FIELD OF THE INVENTION

The present invention relates to sharing a single pin on a semiconductor device for multiple purposes. More particularly, the present invention utilizes a shared, single pin for setting the operating mode of the semiconductor device to either the test mode or the functional mode and once in a proper mode, this pin can serve as the input/output interface for the semiconductor device.

BACKGROUND OF THE INVENTION

Without testing, it is not possible to determine whether all the circuits on an integrated circuit operate according to the design. Conventional semiconductor devices are tested by sequentially providing a series of so-called test vectors to exercise each component contained in the integrated circuit. As the complexity of the integrated circuit increases, the number of test vectors necessarily also increases. This can result in a test taking an unreasonably long time in the sense that it becomes uneconomical to test the device.

It is widely known that present day semiconductor devices can have two modes of operation. They either operate in a test mode or a functional mode. The test mode allows the semiconductor device to be checked structurally without requiring the semiconductor device to receive all the test vectors associated with the semiconductor device while operating in the normal, functional mode. Structural testing generally is a quicker and more efficient method of checking and detecting process defects compared to receiving all the required inputs to check the functionality of the device in the functional mode.

During normal use, the semiconductor device generally remains in the functional mode. Typically, the semiconductor device operates in this test mode only twice during its lifetime; the test mode may be utilized during the manufacturing and quality control processes such as the wafer sorting procedure and the final testing procedure.

By operating the semiconductor device in the test mode of operation, defects within the semiconductor device which are discoverable during full operation are quickly and efficiently found. Prior semiconductor devices required a dedicated test mode pin on the semiconductor package to properly configure the semiconductor device into either the test mode or the functional mode.

For example, FIG. 1 illustrates a sample prior art implementation of a dedicated test mode pin on a semiconductor package to prevent shared global signals from disturbing the functional mode. A test mode pin 10 and an input/output pin 20 are an integral part of a semiconductor device 5. The test mode pin 10 is dedicated to receiving a signal either placing the semiconductor device 5 either into the test mode or the functional mode. The test mode pin 10 is also coupled to a first input of an AND gate 30. Further, the input/output pin 20 is coupled to a second input of the AND gate 30. In this particular example, when the test mode pin 10 receives a high signal, the semiconductor device 5 operates in the test mode. While in the test mode, the first input of the AND gate 30 also remains high such that the output of the AND gate 30 will mirror the input from the input/output pin 20 as represented by a lead line 40. On the other hand, when the test mode pin 10 is low, the semiconductor device 5 operates in the functional mode. Additionally, when the test mode pin 10 is low, the output from the AND gate 30 is held low regardless of the input from the input/output pin 20.

This sample prior art implementation as shown in FIG. 1 relies on combinational logic to control whether the semiconductor device 5 operates in the test mode or the functional mode. In essence, the signal on the test mode pin 10 either passes or blocks the signal on the input/output pin 20 at the output of the AND gate 30. As a result, the current state of the test mode pin 10 determines the present operating mode of the semiconductor device 5. Accordingly in this example, for the semiconductor device 5 to remain operating in the test mode, the test mode pin 10 must remain high. Similarly, if the test mode pin 10 is pulled low, then the semiconductor device 5 immediately operates in the functional mode. Because any change in state of the test mode pin 10 also changes the mode of operation of the semiconductor device 5, the test mode pin 10 cannot be shared with any other function besides determining the mode of operation of the semiconductor device 5.

Unfortunately, many types of semiconductor devices 5 are pin limited, in that the circuit either does not have sufficient space to provide an additional bond pad or the package does not have sufficient pins to allow for a special purpose test pin. To add the extra area to the semiconductor device 5 or an extra pin to the package can be prohibitively expensive. There is a higher cost associated with having the test mode pin 10 dedicated to the mode of operation of the semiconductor device 5. Adding an additional pin to the semiconductor device 5 may not be possible without using a bigger pin count package. This separate, dedicated connection increases the manufacturing costs for each semiconductor device produced.

What is needed is an apparatus and method for utilizing a single pin of a semiconductor device to determine the operating mode of the semiconductor device and also to serve as an input/output interface for the semiconductor.

SUMMARY OF THE INVENTION

The improved semiconductor device test system enables a single, shared pin of the semiconductor device to have multiple functions that include: receiving data that determines the operating mode of the semiconductor device and also receiving data unrelated to the operating mode of the semiconductor device. The improved semiconductor device test system is configured so that the single, shared pin is coupled to a data latch. The data latch is configured to store operating mode data received from the single, shared pin. This operating mode data preferably corresponds to a particular operating mode such as a functional mode or a test mode. Preferably, in response to the operating mode data stored in the data latch, the semiconductor device operates in either the functional mode or the test mode. As long as the data latch stores the operating mode data, this shared, single pin is capable of receiving data unrelated to the operating mode of the semiconductor device without changing the current operating mode of the semiconductor device.

DETAILED DESCRIPTION OF THE PRESENT INVENTION

The present invention enables a single pin of a semiconductor device to be utilized for multiple functions including normal operating mode and test mode. In the present invention, the shared mode setting pin is not limited to determining whether the corresponding semiconductor device operates in the functional mode or the test mode. Instead, in addition to setting the corresponding semiconductor device into either the functional mode or the test mode, the shared test mode pin of the present invention also serves as an input/output interface for the semiconductor device.

Figure 1:
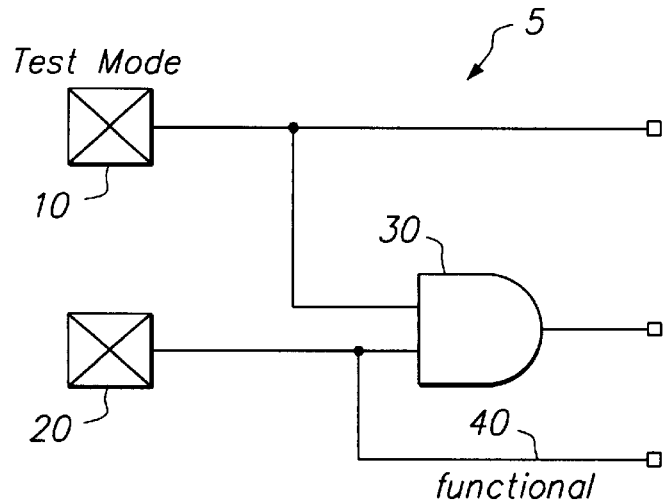
FIG. 1 illustrates a schematic block diagram of the prior art.
Figure 2:
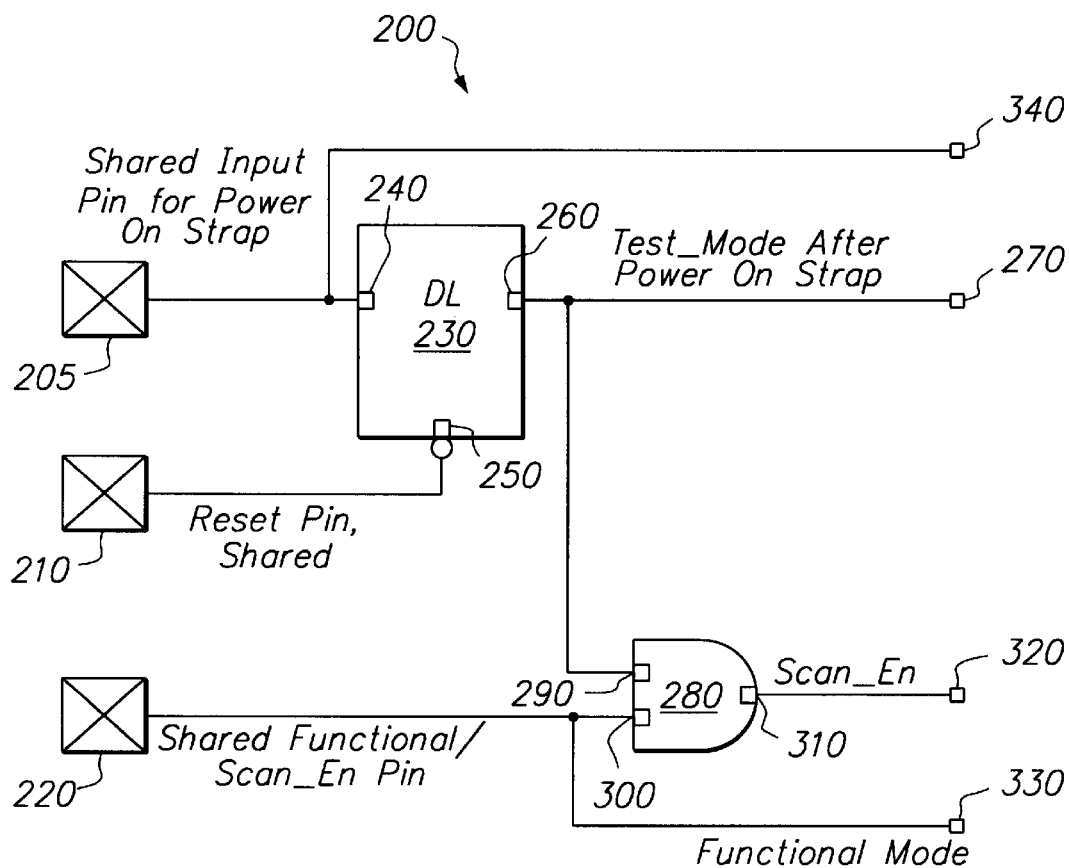
FIG. 2 illustrates a schematic block diagram of the first embodiment of the present invention.

FIG. 2 shows a partial schematic of a semiconductor device 200 and illustrates a first embodiment of the present invention. The pins of the semiconductor package of the semiconductor device 200 preferably include: a shared test setting mode pin 205, a reset pin 210, and a shared input pin 220. The reset pin 210 receives a low active reset signal. The shared mode setting pin 205 preferably receives a signal either corresponding to a data input or test mode/functional mode configuration input during power on reset. The reset pin 210 preferably goes low upon startup of the semiconductor device 200 and remains high thereafter. The shared input pin 220 is configured to receive data for either the test mode or the functional mode.

A data latch 230 is utilized to store operating mode data that determines whether the semiconductor device 200 operates in the test mode or the functional mode. A data input terminal 240 of the data latch 230 is preferably coupled to the shared mode setting pin 205. A controller input terminal 250 of the data latch 230 is preferably coupled to the reset pin 210. An output terminal 260 of the data latch 230 is coupled to a node 270. The node 270 is preferably coupled to a switching circuit (not shown) within the semiconductor device 200 for selecting whether the semiconductor device 200 operates in the test mode or the functional mode. The construction and implementation of this switching circuit would be readily apparent to an ordinary person skilled in the art.

The output terminal 260 of the data latch 230 is shown coupled to a first input 290 of an AND gate 280. A second input terminal 300 of the AND gate 280 is coupled to the shared input pin 220. An output terminal 310 of the AND gate 280 is preferably coupled to a node 320 of the semiconductor device 200. The shared input pin 220 is also preferably coupled to a node 330 of the semiconductor device 200.

In use, the data latch 230 stores the operating mode data from the shared mode setting pin 205. The data latch 230 preferably stores the operating mode data from the shared mode setting pin 205 in response to the reset pin 210 via the input terminal 250. It will be apparent that the reset pin 210 can also drive other circuits in the semiconductor device. The data latch 230 is configured to make this stored operating mode data available to the node 270 through its output terminal 260. While the reset pin 210 is active low, the data latch 230 stores new operating mode data, and any data passed from the shared mode setting pin 205 to the node 340 must be ignored until the mode of operation of the semiconductor device 200 is known. However, when the reset pin 210 is in active high, the stored operating mode data on the data latch 230 remains constant regardless of the data at the input terminal 240. When the operating mode data is latched on the output terminal 260, the shared mode setting pin 205 may resume to serve as the input/output interface for the semiconductor device 200.

Figure 3:
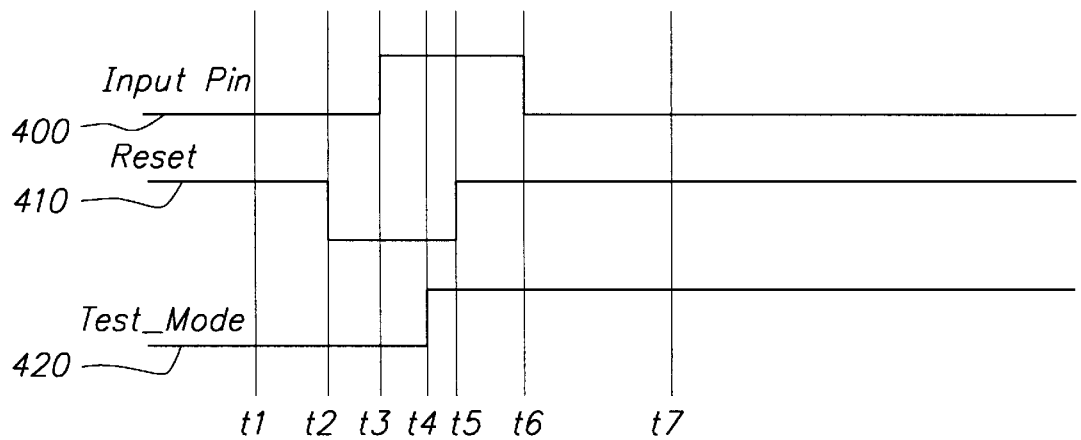
FIG. 3 illustrates a timing diagram showing signals corresponding to the present invention shown in FIG. 2.

FIG. 3 illustrates the timing of certain operations of the circuit disclosed in FIG. 2. In this particular example, when the output terminal 260 goes high in response to voltage values at the reset pin 210 and at the shared mode setting pin 205, then the semiconductor device 200 is in the test mode of operation. Likewise, when the output terminal 260 goes low in response to voltage values at the reset pin 210 and at the shared mode setting pin 205, then the semiconductor device 200 is in the functional mode of operation. Further, the data latch 230 is configured to reset the output terminal 260 with the current value of the input terminal 240 upon the controller terminal 250 going from low to high. These above mentioned parameters are only exemplary. It would be apparent to a person with ordinary skill in the art to vary these parameters without deviating from the scope and intent of the present invention.

In FIG. 3, an input pin signal 400 is representative of the signal supplied to the shared mode setting pin 205 shown in FIG. 2. In addition, a reset pin signal 410 is representative of the signal supplied to the reset pin 210 shown in FIG. 2. A test mode signal 420 shown in FIG. 3 is representative of the signal supplied by the output terminal 260 of the data latch 230 in FIG. 2. At time T1, power is preferably initially applied to the semiconductor device 200. At time T1, the input pin signal 400 is low; the reset pin signal 410 is high; and the test mode signal 420 is low. Since the reset pin signal 410 is initially high, the input pin signal 400 is not latched at the output terminal 260 of the data latch 230. Therefore, the mode of operation of the semiconductor device 200 is unknown at time T1. Further, because the test mode signal is low, the output terminal 310 of the AND gate 280 remains low regardless of the second input terminal 300 of the AND gate 280. At time T2, the reset signal 410 is brought low. It is customary that the reset signal 410 is only brought low one time after the semiconductor device 200 is initially powered up. Upon the reset signal 410 going low, the control terminal 250 of the data latch 230 (shown in FIG. 2) activates the data latch 230 such that the output terminal 260 mirrors the input terminal 240 on the data latch 230.

Further, at time T3, the input pin signal 400 goes high. Immediately following time T3, at time T4, the test mode signal 420 goes high as well. As stated before, as the test mode signal 420 goes high, the semiconductor device 200 operates in the test mode. At time T5, the reset signal 410 goes high, and the test mode signal 420 is locked into a high state. While the test mode signal 420 is held high, the semiconductor device 200 continues to operate in the test mode and the output terminal 310 of the AND gate 280 mirrors the data at the second terminal 300 of the AND gate 280. At time T6, the input pin signal 400 transitions low; the reset pin signal 410 remains high; and the test mode signal 420 remains locked in the high state. During time T6, the test mode signal 420 remains high regardless of the input pin signal 400. At time T7, the input pin signal 400 is low; the reset pin signal 410 remains high; and the test mode signal 420 remains high. As long as the reset pin signal 410 is not pulled low, the test mode signal 420 will remain high regardless of the state of the input pin signal 400.

Figure 4:
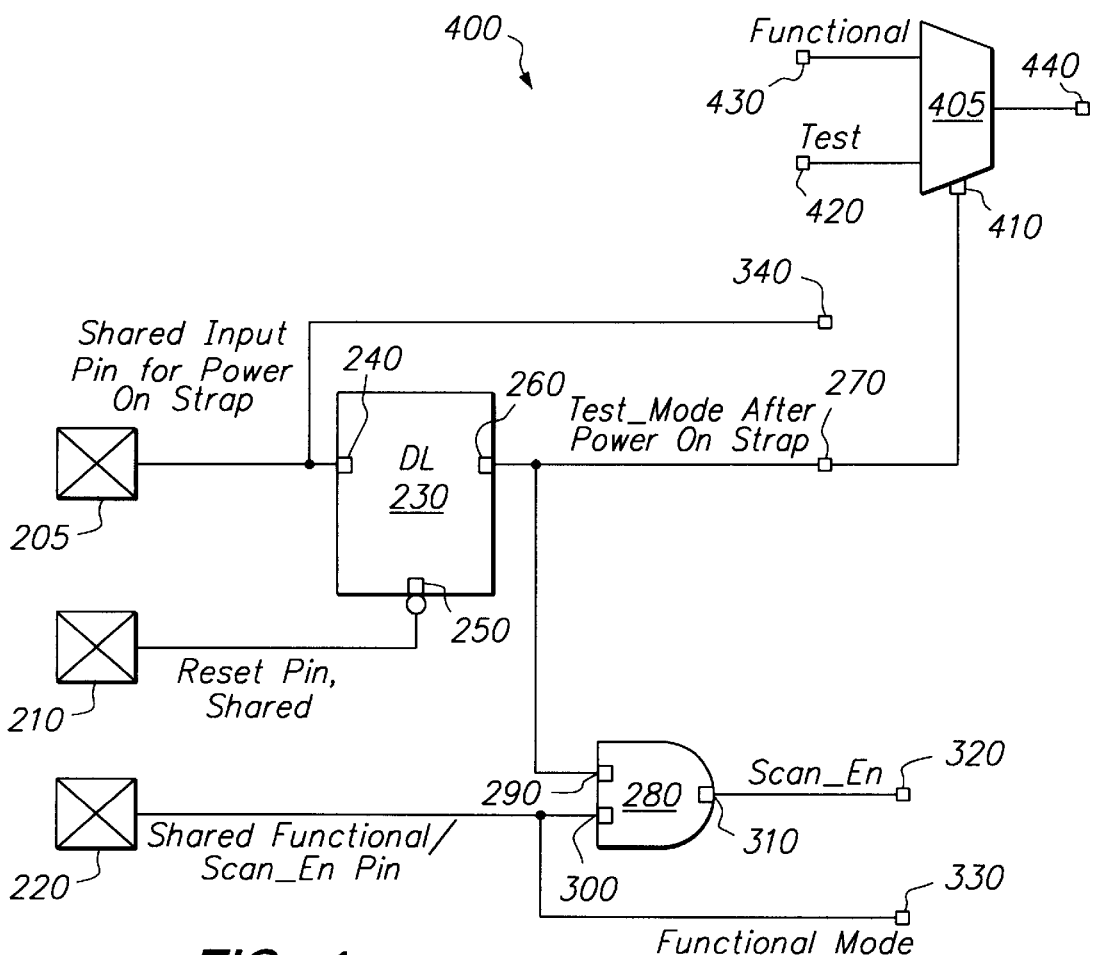
FIG. 4 illustrates a schematic diagram of the second embodiment of the present invention.

FIG. 4 illustrates a partial schematic of a semiconductor device 400 and a second embodiment of the present invention. For the sake of simplicity and clarity, common elements between the semiconductor device 200 and the semiconductor device 400 share common reference numbers. For instance, the data latch 230 and the AND gate 280 along with their associated connections are common to both the semiconductor devices 200, 400. In addition to the common elements, the semiconductor device 400 also comprises: a multiplexer 405, a selector input 410, and nodes 420, 430, and 440.

There are preferably two data inputs coupled to the multiplexer 405. The node 420 is preferably configured to provide the multiplexer 405 with test mode input data corresponding to the semiconductor device 400 operating in the test mode. Further, the node 430 is also preferably configured to provide the multiplexer 405 with functional mode input data corresponding to the semiconductor device 400 operating in the functional mode. The node 270 is preferably coupled to the selector input 410. The node 440 is preferably coupled to an output terminal of the multiplexer 405. As stated before, the node 270 is coupled to the output terminal 260 of the data latch 230 and carries the operating mode data. In use, the multiplexer 405 either passes the test mode data or the functional mode data to the node 440 in response to the signal received by the selector input 410. Preferably, while the semiconductor device 400 operates in the test mode, the test mode input data from the node 420 passes through the multiplexer 405 to the node 440. Similarly, while the semiconductor device 400 operates in the functional mode, the functional mode input data from the node 430 passes through the multiplexer 405 to the node 440.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the present invention.

Specifically, it will be apparent to one of ordinary skill that the device of the present invention could be implemented in several different ways and the apparatus disclosed above is only illustrative of the preferred embodiment of the invention and is in no way a limitation. For example, the first and second embodiments described above and shown in FIGS. 2 and 4 are described in terms of a data latch for storing the operating mode data. However, it would be apparent to those skilled in the art to substitute the data latch for a set/reset flip-flop or a data flip-flop without departing from the spirit and scope of the present invention.

What is claimed is:

1. A semiconductor device having two modes of operation, the semiconductor device comprising:
   a. a mode setting input terminal for receiving a first signal representative of one of the two modes of operation;
   b. a latch for storing the first signal, the latch coupled to the mode setting input terminal;
   c. a reset pin for receiving one of a reset signal to store the first signal in the latch and an operational signal to allow the mode setting input terminal to receive data.

2. A semiconductor device having two modes of operation, the semiconductor device comprising:
   a. a reset pin;
   b. a latch for storing a first signal, the latch having an input terminal and a control terminal, wherein the control terminal is coupled to the reset pin and further wherein the first signal instructs the semiconductor device to operate in one of the two modes of operation; and
   c. a shared pin coupled to the input terminal of the latch, the shared pin configured for receiving the first signal and sending the first signal to the latch and for receiving a second signal that is unrelated to instructing the semiconductor device to operate in one of the two modes of operation.

3. The semiconductor device according to claim 2 wherein the two modes of operation comprise a functional mode and a test mode.

4. A semiconductor device having a plurality of operating modes, the semiconductor device comprising:
   a. a latch having an input terminal, a control terminal, and an output terminal, wherein the output terminal is configured to store a first signal, wherein the first signal instructs the semiconductor device to operate in one of the plurality of operating modes;
   b. a reset pin coupled to the control terminal wherein the reset pin is configured to signal the latch to store the first signal in the latch; and
   c. a shared pin coupled to the input terminal configured for passing the first signal to the output terminal of the latch and for passing a second signal that is unrelated to instructing the semiconductor device to operate in one of the plurality of operating modes.

5. The semiconductor device according to claim 4 wherein the plurality of operating modes comprise a functional mode and a test mode.

6. A semiconductor device having a plurality of operating modes, the semiconductor device comprising:
   a. a shared pin for receiving both a first signal and a second signal, wherein the first signal instructs the semiconductor device to operate in one of the plurality of operating modes, and further wherein the second signal is unrelated to instructing the semiconductor device to operate in one of the plurality of operating modes; and
   b. means for storing coupled to the shared pin configured to store the first signal such that the semiconductor device operates in one of the plurality of operating modes in response to the first signal.

7. The semiconductor device according to claim 6 wherein the plurality of operating modes comprise a functional mode and a test mode.

8. The semiconductor device according to claim 6 wherein the means for storing is a data latch.

9. A method of sharing a single pin on a semiconductor device for receiving one of a first signal and a second signal, wherein the first signal indicates a current operating mode and the second signal is unrelated to indicating the current operating mode, the method comprising the following steps:
   a. receiving the first signal through the single pin;
   b. receiving the second signal through the single pin;
   c. operating the semiconductor device in the current operating mode in response to the first signal; and
   d. storing the first signal within the semiconductor device such that the semiconductor continues to operate in the current operating mode.

* * * * *

UNITED STATES PATENT AND TRADEMARK OFFICE
CERTIFICATE OF CORRECTION

PATENT NO. : 6,075,396
APPLICATION NO. : 09/099630
DATED : June 13, 2000
INVENTOR(S) : Amerian et al.

It is certified that error appears in the above-identified patent and that said Letters Patent is hereby corrected as shown below:

On the title page, item [56]
<u>IN THE REFERENCES CITED, add:</u>

--5,659,508    8/1997    Lamphier et al.    365/201--
    --4,604,692    8/1986    Murakami    364/200--

Signed and Sealed this

Seventh Day of August, 2007

JON W. DUDAS
*Director of the United States Patent and Trademark Office*